United States Patent
Mizuno et al.

(10) Patent No.: US 7,622,725 B2
(45) Date of Patent: Nov. 24, 2009

(54) IMPURITY INTRODUCING APPARATUS AND IMPURITY INTRODUCING METHOD

(75) Inventors: Bunji Mizuno, Nara (JP); Ichiro Nakayama, Osaka (JP); Yuichiro Sasaki, Tokyo (JP); Tomohiro Okumura, Osaka (JP); Cheng-Guo Jin, Osaka (JP); Hiroyuki Ito, Chiba (JP)

(73) Assignee: Panaosnic Corporation, Osaka (JP)

( * ) Notice: Subject to any disclaimer, the term of this patent is extended or adjusted under 35 U.S.C. 154(b) by 0 days.

(21) Appl. No.: 12/122,492

(22) Filed: May 16, 2008

(65) Prior Publication Data

US 2008/0210167 A1 Sep. 4, 2008

Related U.S. Application Data

(63) Continuation of application No. 11/887,371, filed on Mar. 24, 2008.

(30) Foreign Application Priority Data

Mar. 30, 2005 (JP) ............................. 2005-099150
Mar. 29, 2006 (WO) ................. PCT/JP2006/306564

(51) Int. Cl.
G21K 1/093 (2006.01)
H01J 37/08 (2006.01)

(52) U.S. Cl. ............. 250/492.3; 250/492.1; 250/492.21

(58) Field of Classification Search ............ 250/492.21, 250/492.3
See application file for complete search history.

(56) References Cited

U.S. PATENT DOCUMENTS

| 4,803,947 A | 2/1989 | Ueki et al. |
| 4,912,065 A | 3/1990 | Mizuno et al. |
| 5,561,072 A | 10/1996 | Saito |
| 5,858,106 A | 1/1999 | Ohmi et al. |
| 5,858,863 A | 1/1999 | Yokoyama et al. |
| 6,007,675 A | 12/1999 | Toshima |
| 6,036,772 A | 3/2000 | Hino et al. |

(Continued)

FOREIGN PATENT DOCUMENTS

EP      1 054 433 A1    11/2000

(Continued)

OTHER PUBLICATIONS

Sasaki, Y., et al., "$B_2H_6$ Plasma Doping with 'In-situ He Pre-amorphization'", 2 pages.

(Continued)

*Primary Examiner*—David A Vanore
(74) *Attorney, Agent, or Firm*—McDermott Will & Emery LLP

(57) ABSTRACT

It is an object to prevent functions expected originally from being unexhibited when impurities to be introduced into a solid sample are mixed with each other, and to implement plasma doping with high precision. In order to distinguish impurities which may be mixed from impurities which should not be mixed, first of all, an impurity introducing mechanism of a core is first distinguished. In order to avoid a mixture of the impurities in very small amounts, a mechanism for delivering a semiconductor substrate to be treated and a mechanism for removing a resin material to be formed on the semiconductor substrate are used exclusively.

4 Claims, 5 Drawing Sheets

U.S. PATENT DOCUMENTS

| | | |
|---|---|---|
| 6,099,598 A | 8/2000 | Yokoyama et al. |
| 6,207,005 B1 | 3/2001 | Henley et al. |
| 6,321,134 B1 | 11/2001 | Henley et al. |
| 6,329,229 B1 | 12/2001 | Yamazaki et al. |
| 6,391,114 B1 | 5/2002 | Kirimura |
| 6,403,410 B1 | 6/2002 | Ohira et al. |
| 6,503,365 B1 | 1/2003 | Kim et al. |
| 6,541,353 B1 | 4/2003 | Sandhu et al. |
| 6,576,061 B1 | 6/2003 | Moriyama et al. |
| 6,725,119 B1 | 4/2004 | Wake |
| 6,726,776 B1 | 4/2004 | Mosely et al. |
| 6,897,100 B2 | 5/2005 | Yamazaki et al. |
| 7,090,741 B2 | 8/2006 | Narushima et al. |
| 2003/0029833 A1 | 2/2003 | Johnson |
| 2003/0073318 A1 | 4/2003 | Sandhu et al. |
| 2004/0040504 A1 | 3/2004 | Yamazaki et al. |
| 2004/0107020 A1 | 6/2004 | Yokoyama et al. |
| 2004/0211356 A1 | 10/2004 | Yamazaki et al. |
| 2005/0051271 A1* | 3/2005 | Collins et al. ......... 156/345.31 |
| 2005/0126487 A1 | 6/2005 | Tabuchi et al. |
| 2006/0011213 A1 | 1/2006 | Moriya et al. |
| 2006/0260545 A1 | 11/2006 | Ramaswamy et al. |

FOREIGN PATENT DOCUMENTS

| | | |
|---|---|---|
| JP | 58-180227 | 10/1983 |
| JP | SHO-62-69511 | 3/1987 |
| JP | 5-314944 | 11/1993 |
| JP | 7-122622 | 5/1995 |
| JP | 7-58695 | 6/1995 |
| JP | 7-142421 | 6/1995 |
| JP | 10-27771 | 1/1998 |
| JP | 2780419 | 5/1998 |
| JP | 2001-102347 | 4/2001 |
| JP | 2004-71774 | 3/2004 |
| JP | 2004-87600 | 3/2004 |
| JP | 2004-179592 | 6/2004 |
| JP | 2004-519070 | 6/2004 |
| KR | 2001-0035947 | 5/2001 |
| KR | 2002-0067829 | 8/2002 |
| WO | WO 2004/075274 A1 | 9/2004 |
| WO | WO 2005/020306 | 3/2005 |
| WO | WO 2006/064772 A1 | 6/2006 |

OTHER PUBLICATIONS

Sasaki, Y., et al., "Helicon Wave Plasma Doping System", Extended Abstracts of International Workshop on Junction Technology, 2002, Japan Society of Applied Physics.

Liebert, R.B., et al., "Plasma doping system for 200 and 300 mm wafers", Conference on Ion Implantation Technology, 2000, pp. 472-475, IEEE, Alpbach, Austria.

Higaki, R., et al., "Effects of gas phase absorption into Si substrates on plasma doping process", 2003, pp. 231-234, IEEE.

Sato, T., et al., "Effects of wet cleaning treatment on dose of impurity after plasma doping", Proceeding of the 34th European Solid-State Device Research Conference 2004, ESSDERC 2004, Sep. 21-23, 2004, pp. 149-152, IEEE.

Tsutsui, K., et al., "Effects of substrate surface conditions on dose controllability of plasma doping process", Proceedings on 7th International Conference on Solid-State and Integrated Circuits Technology 2004, Oct. 18-21, 2004, pp. 439-444, vol. 1, IEEE.

Cho, W., et al., "Elevated temperature plasma doping technology for sub-50 nm SOI n-MOSFETs", The Fourth International Workshop on Junction Technology, 2004 IWJT '04, Mar. 15-16, 2004, pp. 62-64, IEEE.

Baek, S., et al., "Characteristics of HfO$_2$ pMOSFET Prepared by B$_2$H$_6$ Plasma Doping and KrF Excimer Laser Annealing", IEEE Electron Device Letters, Mar. 2005, pp. 157-159, vol. 26, No. 3, IEEE.

Walther, S.R., et al., "Shallow Junction Technology for Advanced CMOS Devices—Transitioning to Plasma Doping from Beamline Implantation", 2002, pp. 103-106, IEEE.

Bright, AA, "Gate Quality Thin Oxide by Plasma Oxidation in a Very Dilute Oxygen Plasma", IBM Technical Disclosure Bulletin, Dec. 1990, pp. 446-447.

Eldridge, J.M., et al., "Novel Process for Patterning Photoresists Suitable for Metal RIE Advanced lc Fabrication" IBM Technical Disclosure Bulletin, Nov. 1985, p. 2500.

* cited by examiner

IMPURITY INTRODUCING APPARATUS AND IMPURITY INTRODUCING METHOD

RELATED APPLICATIONS

This application is a Continuation of U.S. application Ser. No. 11/887,371, filed Sep. 28, 2007, which is a U.S. National Phase under 35 U.S.C. § 371 of International Application No. PCT/JP2006/306564, filed on Mar. 29, 2006, claiming priority of Japanese Application No. 2005-099150, filed on Mar. 30, 2005, the entire content of each of which are hereby incorporated by reference.

TECHNICAL FIELD

The present invention relates to an impurity introducing apparatus and an impurity introducing method, and more particularly to a plasma doping apparatus and a plasma doping method which serve to implant an ion onto a surface of a solid sample by using a plasma.

BACKGROUND ART

There has been proposed a technique referred to as plasma doping in order to introduce a P-type impurity or an N-type impurity when forming a PN junction in a process for manufacturing a semiconductor such as a transistor.

This serves to expose a semiconductor substrate to a plasma containing an electrically active impurity to introduce an impurity into a surface portion of the semiconductor substrate with an energy of a plasma when doping the semiconductor substrate with the impurity.

Referring to a necessary impurity for a semiconductor, however, a purification or a quantitative control at an element and molecule level of the impurity is required in order to definitely give characteristics thereof, for example, electrically positive and negative characteristics.

In the case of some closing or semi-closing environment, more specifically, a vacuum chamber or an atmospheric pressure plasma, the plasma doping is carried out in a plasma treating mechanism in order to confine the plasma. For this reason, a thin film containing an impurity substance is deposited in a portion provided in contact with the plasma in a substance constituting the closing or semiclosing environment. The deposited substance comes in contact with the plasma, and is thus sputtered again by the energy of the plasma and is mixed into the plasma in some cases, and the plasma and the thin film are brought into a kind of stationary state by a synthesis of competing processes of the deposition and the sputtering. If the deposited substance is homogeneous to the impurity in the plasma, a balance is maintained by the deposition and a remixture. If the deposited substance is heterogeneous, a different kind of substance from the impurity contained in the plasma is mixed into the plasma. Consequently, the characteristic of the impurity contained in the plasma is confused. As a result, it is impossible to accurately control the characteristic and amount of the impurity to be doped into a semiconductor thin film. For this reason, the plasma doping method is used with difficulties in a manufacture of a semiconductor on which the characteristic greatly depends based on a very small difference in an amount.

The inventors have proposed that a vacuum chamber is sorted every type of an impurity to provide a special chamber in order to avoid the mixture (Patent Document 1). According to the Patent Document 1, for example, a right chamber is used as a P-type doping chamber 50 and a left chamber is used as an N-type doping chamber 60 in FIG. 5. A semiconductor substrate 130 is subjected to P-type patterning with a photoresist and P-type doping is performed in the chamber 50, and subsequently, the semiconductor substrate 130 is subjected to N-type patterning with the photoresist and N-type doping is performed in the chamber 60. By disposing the special plasma chamber for each desirable impurity, thus, it is possible to avoid the mixture of impurities having different characteristics. Therefore, it has been found that the plasma doping can be utilized in the manufacture of the semiconductor.

The inventors according to the invention further found that an amorphization of a silicon single crystal substrate through an inert gas, particularly, a He plasma plays a very important part (Patent Document 2). More specifically, even if a large amount of He is irradiated for a long period of time in a He ion implantation through a conventional beam line ion implantation, the silicon single crystal substrate cannot be amorphized. This has been a common sense of an ion implantation industry before 2004. When the plasma is used, however, a large amount of He (which is almost 100 times as large as the amount of an ion implantation) is irradiated in a unit time at a much lower energy as compared with the past common sense. For this reason, it has been found that the silicon single crystal is also amorphized.

Referring to the effect of the amorphization through He, an impurity is introduced subsequently to or simultaneously with the amorphization so that a profile in a direction of a depth of the impurity is changed to be preferable (Non-Patent Document 1). Consequently, it is possible to produce a special advantage linked to an enhancement in a uniformity and a control of the amount of the impurity.

It is obvious that a simple mixture of an impurity, for example, $B_2H_6$ into He does not produce a special effect. When the inventors made an experiment for plasma doping in the early stage, $B_2H_6$ was diluted into 5% with He and was thus used as described in Patent Document 4. However, it was impossible to produce the advantage of the amorphization.

Patent Document 1: Japanese Patent No. 2780419 Specification

Patent Document 2: Japanese Patent Application No. 2003-041123

Patent Document 3: Japanese Patent Application No. 2004-360122

Patent Document 4: Japanese Patent No. 2022204 Specification

Non-Patent Document 1: Y. Sasaki et al., "B2H6 Plasma Doping with In-situ He Pre-amorphyzation", 2004 Symposia on VLSI Technology and Circuits Patent Document 5: JP-A-2004-179592

DISCLOSURE OF THE INVENTION

Problems that the Invention is to Solve

It was found that substances are mixed in very small amounts in a mechanism for delivering a semiconductor substrate and a step of removing a pattern through a photoresist formed on a semiconductor substrate in addition to a main mechanism for executing plasma doping, for example, a plasma chamber, and there has been a problem in that a confusion on the semiconductor substrate due to the mixture of a very small amount of substances which did not matter at all in 1990 in which the patent application described in the Patent Document 1 was filed, that is, a so-called contamination is generated.

The invention has been made in consideration of the actual circumstances and has an object to provide an impurity introducing method and an impurity introducing apparatus which can prevent a contamination and can introduce a desirable impurity with a high controllability.

Means for Solving the Problems

Referring to impurities to be introduced into a semiconductor substrate, in the case in which there is no problem even if different kinds of impurities are mixed with each other, they can be treated at the same time. However, it is necessary to perfectly eliminate a combination in which a manufacture of a semiconductor apparatus is adversely influenced when they are mixed with each other. In addition to the following distinction of a reaction chamber, it is also necessary to distinguish a step in relation to a mechanism for delivering a treated wafer or a poststep (a removal of a photoresist will be taken as an example). More specifically, plasma doping is a method of introducing an impurity by a contact with a plasma differently from an ion implantation for implanting an ion having a high energy. Therefore, it was found that a considerably small amount of contamination greatly influences the manufacture of the semiconductor apparatus. By paying attention thereto, the combination in which the impurities are mixed with each other to have a bad influence is eliminated completely.

Accordingly, a combination of plasma doping steps which makes a distinction depending on a characteristic of an impurity is as follows.

1 A helium plasma amorphization (HePA) is executed in P-type and N-type regions on a semiconductor substrate through a chamber A at the same time, and patterning is carried out using a photoresist to execute $B_2H_6$ doping over the P-type region through a chamber B. Subsequently, the N-type region is patterned with the photoresist and is thus opened, and $PH_3$ doping is executed through a chamber C.

2 The patterning is carried out over the semiconductor substrate by using the photoresist to execute the HePA over the P-type region through the chamber A, and subsequently, to execute the $B_2H_6$ doping. Next, the N-type region is patterned by using the photoresist and is thus opened to execute the HePA through the chamber B, and subsequently, to dope $PH_3$.

3 The patterning is carried out over the semiconductor substrate by using the photoresist to execute boron doping over the P-type region by a $B_2H_6$ plasma diluted with He into a dilution rate which has a HePA effect through the chamber A. Subsequently, the N-type region is patterned by using the photoresist and is thus opened to carry out phosphorus doping with a plasma by $PH_3$ diluted with He into a dilution rate which has the HePA effect through the chamber B.

Also in an ashing or removing process for a photoresist which is usually executed after doping an impurity, moreover, a treating mechanism is used in a step of a plasma or a wet type. Therefore, an impurity stuck to the photoresist or a semiconductor substrate and a thin film adheres to an inner part of the treating mechanism again. It is impossible to avoid the mixture of the substance thus stuck in another treatment again. Even if the amount of the mixture is very small, however, there is a high possibility that an inside of the semiconductor substrate might be confused to reduce a yield of the newest semiconductor apparatus.

Accordingly, it was devised to distinguish treating mechanisms every characteristic of an impurity, thereby avoiding a mixture at the photoresist removing step to enhance the yield of the semiconductor. However, at least two kinds of photoresist removing mechanisms are used exclusively. In small scale factories, particularly, the devisal causes an increase in a cost. For this reason, it is preferable to determine an employment based on a relationship with the yield.

In order to exhibit a serial function, furthermore, coupling through one vacuum coupling portion and an accommodation in an integral enclosure are effective in another sense, that is, a surface of the semiconductor can be prevented from being oxidized and particles can be prevented from being stuck. Even if the action is not taken, the contents of the invention can be utilized substantially. More specifically, by using wafer delivering mechanisms managed highly in a semiconductor manufacturing factory and their managing functions, it is possible to exhibit a serial function by the presence of an apparatus group capable of fulfilling the same function as a result even if a great distance is made therebetween or they are not stored in one enclosure for reasons of an arrangement in the factory. In the extreme, also in the case in which a certain step described in the invention is to be executed in a factory A and the other steps are to be executed in a factory B, other slight adverse effects such as a contamination from an ambient or an increase in particles can be supposed. However, the execution is not very hard in these days in which a highly physical distribution system maintaining a cleanness between the factories is established, and does not distort the essence and main point of the invention and does not depart from the scope of the invention but can be basically achieved.

More specifically, the invention provides an impurity introducing apparatus and an apparatus group which use a plasma in treatments at all of steps or a part of the steps to introduce plural kinds of impurities into a solid sample, wherein at least one of the following mechanisms is included or one of the following mechanisms is intended for the apparatus group in such a manner that respective impurities are not mixed with each other in the case in which mutual specific functions are damaged if desirable impurities which are required for the introduced impurity to directly or indirectly cause a solid sample to retain electrical, mechanical or some specific functions are mixed with each other during a treatment at an impurity introducing step:

1 an impurity introducing mechanism which is independent every desirable impurity;

2 a solid sample delivering mechanism which is independent every desirable impurity;

3 a delivering mechanism for linking the impurity introducing mechanism and the solid sample delivering mechanism which are independent every desirable impurity;

4 a mechanism set exclusively every desirable impurity and serving to remove a resin to prevent a mixture with the other impurities;

5 a sample delivering mechanism for linking a plurality of impurity introducing apparatuses which is independent every desirable impurity; and 6 a mechanism for delivering a sample and a sample group between the impurity introducing apparatuses which are independent every desirable impurity and an apparatus for removing a resin.

The desirable impurity implies an impurity required for the introduced impurity to directly or indirectly cause the solid sample to retain the electrical, mechanical or some specific functions, and may be one impurity or plural kinds of impurities.

In the invention, in a manufacture of a semiconductor apparatus prior to a design of the apparatus, the apparatus is designed to execute, by independent mechanisms, a step of extracting a step requiring a plasma step, a step of extracting an impurity which is necessary for the extracted step, a step of deciding whether the impurity influences subsequent steps or not, a step of extracting any of the steps which is decided to have an influence at the deciding step, and the extracted step.

Moreover, the invention provides an impurity introducing apparatus and an apparatus group which use a plasma in treatments at all of steps or a part of the steps to introduce plural kinds of impurities into a semiconductor substrate or a semiconductor thin film, wherein at least one of the following mechanisms is included or one of the following mechanisms is intended for the apparatus group in such a manner that respective impurities are not mixed with each other in the case in which mutual specific functions are damaged if desirable impurities which are required for the introduced impurity to directly or indirectly cause a solid sample to retain an electrical specific function are mixed with each other during a treatment at an impurity introducing step:

1 an impurity introducing mechanism which is independent every desirable impurity;

2 a solid sample delivering mechanism which is independent every desirable impurity;

3 a delivering mechanism for linking the impurity introducing mechanism and the solid sample delivering mechanism which are independent every desirable impurity;

4 a mechanism set exclusively every desirable impurity and serving to remove a resin to prevent a mixture with the other impurities;

5 a sample delivering mechanism for linking a plurality of impurity introducing apparatuses which is independent every desirable impurity; and 6 a mechanism for delivering a sample and a sample group between the impurity introducing apparatuses which are independent every desirable impurity and an apparatus for removing a resin.

In addition, the invention provides an impurity introducing apparatus and an apparatus group which use a plasma in treatments at all of steps or a part of the steps to introduce plural kinds of impurities into a solid sample, wherein at least one of the following mechanisms is included or one of the following mechanisms is intended for the apparatus group in such a manner that nonpreferable impurities are not mixed with each other in the case in which desirable impurities required for causing the solid sample to retain electrical, mechanical or some specific functions do not damage the function even if they are mixed with each other during a treatment at an impurity introducing step in some combination and damage the mutual specific functions in the other combination:

1 an impurity introducing mechanism capable of simultaneously introducing impurities which do not damage the function even if they are mixed with each other;

2 a solid sample delivering mechanism which is exclusively independent for only the combination of the impurities which do not damage the function even if they are mixed with each other;

3 a solid sample delivering mechanism for exclusively and independently delivering only a solid sample into which impurities which do not damage the function even if they are mixed with each other are to be introduced or the impurities are introduced;

4 a mechanism set exclusively every combination of the impurities which do not damage the function even if they are mixed with each other and serving to remove a resin to prevent a mixture with nonpreferable impurities;

5 a sample delivering mechanism for linking a plurality of impurity introducing apparatuses set exclusively every combination of the impurities which do not damage the function even if they are mixed with each other; and 6 a mechanism for delivering a sample and a sample group between the impurity introducing apparatuses set exclusively every combination of the impurities which do not damage the function even if they are mixed with each other and an apparatus for removing a resin.

Furthermore, the invention provides an impurity introducing apparatus and an apparatus group which use a plasma in treatments at all of steps or a part of the steps to introduce plural kinds of impurities into a semiconductor substrate and a semiconductor thin film, wherein at least one of the following mechanisms is included or one of the following mechanisms is intended for the apparatus group in such a manner that nonpreferable impurities are not mixed with each other in the case in which desirable impurities required for causing the solid sample to directly or indirectly retain an electrical specific function do not damage the function even if they are mixed with each other during a treatment at an impurity introducing step in some combination and damage the mutual specific functions in the other combination:

1 an impurity introducing mechanism capable of simultaneously introducing impurities which do not damage the function even if they are mixed with each other;

2 a solid sample delivering mechanism which is exclusively independent for only a combination of the impurities which do not damage even if they are mixed with each other;

3 a solid sample delivering mechanism for exclusively and independently delivering a solid sample into which the impurities which do not damage the function even if they are mixed with each other are to be introduced or the impurities are introduced;

4 a mechanism set exclusively every combination of the impurities which do not damage the function even if they are mixed with each other and serving to remove a resin to prevent a mixture with nonpreferable impurities;

5 a sample delivering mechanism for linking a plurality of impurity introducing apparatuses set exclusively every combination of the impurities which do not damage the function even if they are mixed with each other; and 6 a mechanism for delivering a sample and a sample group between the impurity introducing apparatuses set exclusively every combination of the impurities which do not damage the function even if they are mixed with each other and an apparatus for removing a resin.

In the invention, moreover, some of electrically direct specific functions have a characteristic of a positive P type and the others have a characteristic of a negative N type.

In the invention, furthermore, electrical indirect specific functions have a function of changing coupling states of crystal, polycrystal and amorphous lattices, and atoms and molecules.

In the invention, moreover, the function of changing the coupling states of the crystal and polycrystal lattices and the atoms and molecules has an amorphizing function.

Furthermore, the invention provides an impurity introducing method of introducing plural kinds of impurities into a solid sample by using a plasma in treatments at all of steps or a part of the steps, wherein at least one of steps using the following mechanisms is included or one of steps using the following mechanisms is intended for a combination of the steps in such a manner that respective impurities are not mixed with each other in the case in which desirable impurities required for the introduced impurity to directly or indirectly cause a solid sample to retain electrical, mechanical or some specific functions damage mutual specific functions if they are mixed with each other in a treatment at an impurity introducing step:

1 an impurity introducing step to be executed by using an impurity introducing mechanism which is independent every desirable impurity;

2 a delivering step to be executed by a solid sample delivering mechanism which is independent every desirable impurity;

3 a delivering step to be executed by a delivering mechanism for linking the impurity introducing mechanism and the solid sample delivering mechanism which are independent every desirable impurity;

4 a resin removing step to be executed by a mechanism set exclusively every impurity and serving to remove a resin to prevent a mixture with the other impurities;

5 a delivering step to be executed by a sample delivering mechanism for linking a plurality of impurity introducing apparatuses which is independent every desirable impurity; and 6 a delivering step to be executed by a mechanism for delivering a sample and a sample group between the impurity introducing apparatuses which are independent every desirable impurity and an apparatus for removing a resin.

In the invention, the impurity implies a substance which influences an electrical characteristic indirectly and greatly through an amorphization, for example, a He plasma in addition to a directly electrically active substance which is generally represented by a semiconductor.

In the invention, moreover, at least one of the following mechanisms is included or one of the following mechanisms is intended for the apparatus group in such a manner that respective impurities are not mixed with each other as well as the impurity introducing apparatus itself.

EFFECTS OF THE INVENTION

According to the invention, a substance to retain electrically positive and negative characteristics is prevented from being mixed at a certain step in an introduction of an impurity into a semiconductor substrate in a manufacture of a semiconductor apparatus, thereby contributing to an accurate manufacture of the semiconductor apparatus. More specifically, a method of distinguishing an impurity is shown and a solution can be carried out in consideration of the circumstances such as a cost performance in a manufacturing factory.

Figure 1:
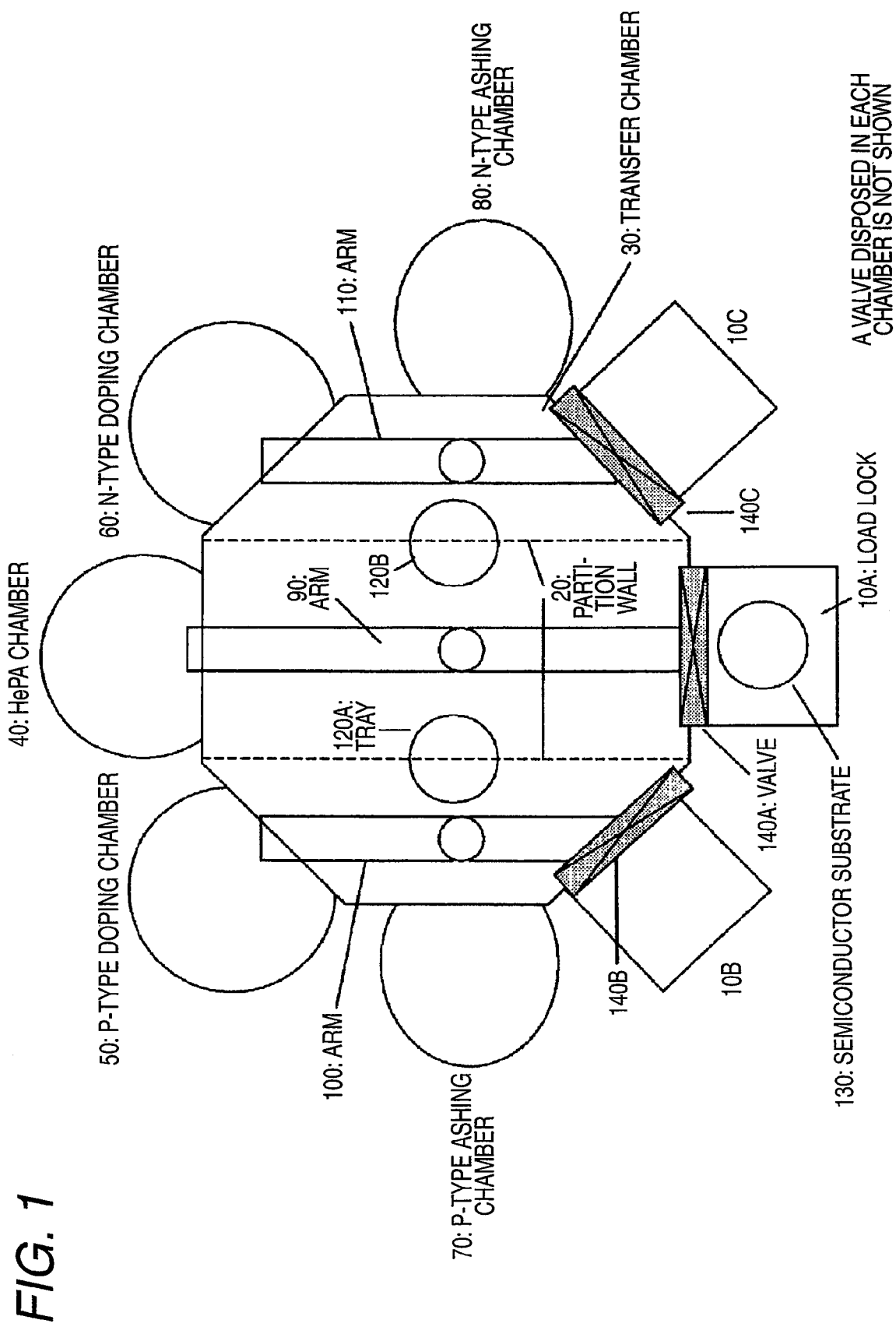
FIG. 1 is a plan view showing an apparatus for explaining a first embodiment according to the invention.

EXPLANATION OF DESIGNATIONS 10 load lock
20 partition wall
30 transfer chamber
40 HePA chamber
50 P-type doping chamber
60 N-type doping chamber
70 P-type ashing chamber
80 N-type ashing chamber
90 arm
100 arm
106 arm
110 arm
116 arm
120 tray
122 plasma source
124 plasma
130 semiconductor substrate
132 substrate table
140 valve

BEST MODE FOR CARRYING OUT THE INVENTION

Embodiments according to the invention will be described below with reference to the drawings. The invention is not restricted to the following embodiments.

FIRST EMBODIMENT

An embodiment according to the invention will be described with reference to FIG. 1. A plasma doping apparatus is an example in which a plasma in a vacuum state is utilized. If it is possible to make the best of features of various plasmas, the plasma in the vacuum state is not restricted.

The example features that a He plasma amorphization (HePA) is carried out and impurity doping is then performed.

In the invention, in an apparatus having a structure which will be described below, three load locks 10 are provided and five plasma chambers are disposed in a transfer chamber 30 having a structure which can be separated through a partition wall 20 depending on uses. The five plasma chambers are constituted by a HePA chamber 40, a P-type doping chamber 50 using $B_2H_6$, an N-type doping chamber 60 using $PH_3$, a P-type ashing chamber 70 for removing a photoresist on a semiconductor substrate subjected to P-type doping, and an N-type ashing chamber 80 for removing a photoresist on a semiconductor substrate subjected to N-type doping, respectively. In order to deliver the semiconductor substrate among the load lock, the transfer chamber, and the plasma chamber, a robot arm is disposed. The robot arm is designed to be freely rotatable at 360 degrees. In this case, three types of a HePA arm 90, a P-type doping arm 100 and an N-type doping arm 110 are prepared to avoid a mutual mixture. A tray 120 is disposed in such a manner that the semiconductor substrate can be transferred in a HePA portion and a doping portion if necessary.

Figure 2:
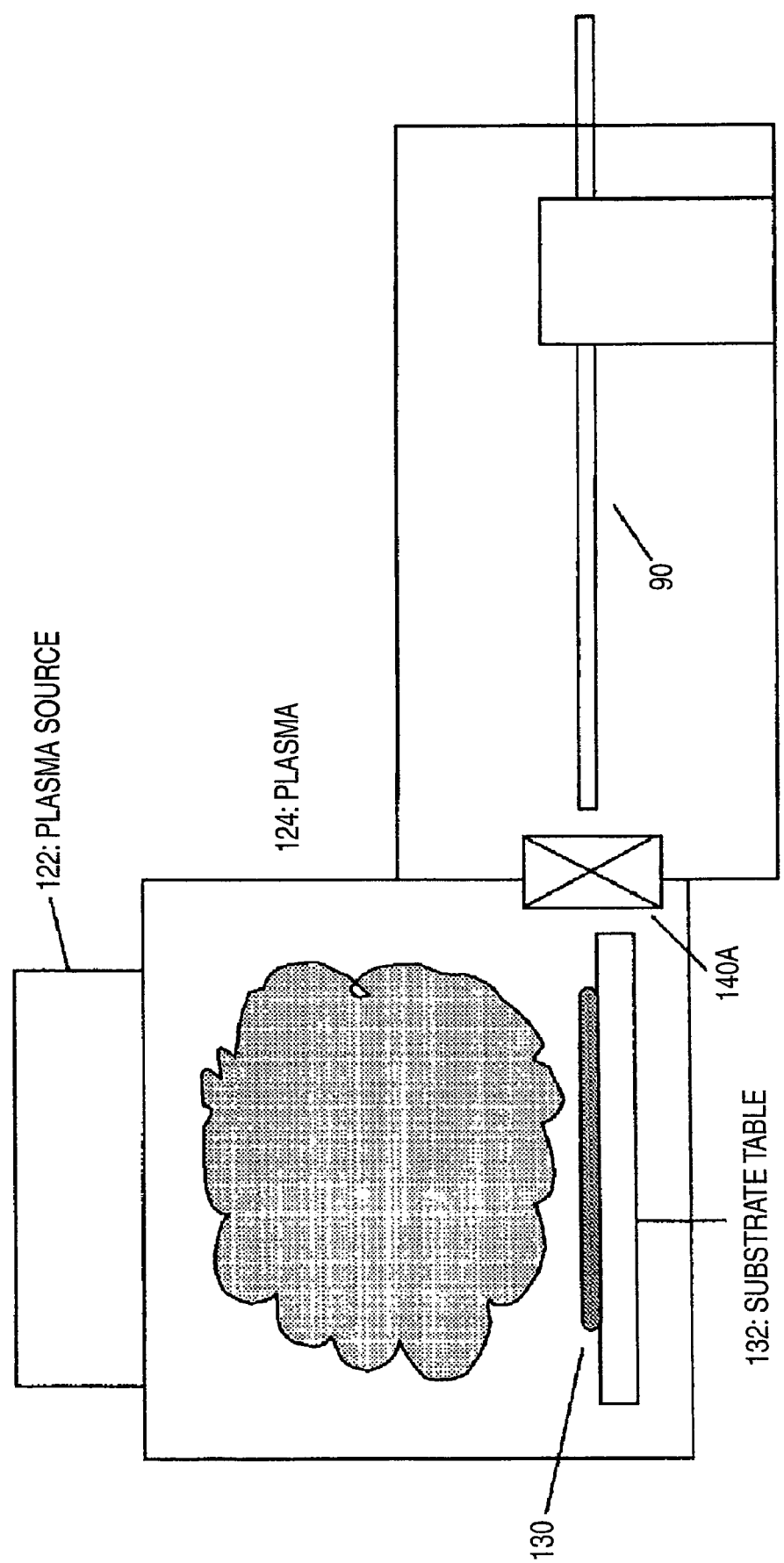
FIG. 2 is a sectional view showing a structure of the apparatus for explaining a structure of a chamber according to the invention.

Basic structures of the five plasma chambers will be described with reference to FIG. 2. FIG. 2 shows a sectional structure of the HePA chamber according to an example. A plasma source 122 is disposed in the plasma chamber 40. A gas introducing mechanism is not shown in the drawings but a gas or an impurity material is introduced into the chamber 40 to generate a plasma 124. A semiconductor substrate 130 to be treated is mounted on a substrate table 132. The substrate 130 has such a structure that it can be moved to a substrate table 180 from the transfer chamber via a valve 140A by using the arm 90.

Description will be given to a method of manufacturing a semiconductor apparatus using the apparatus. At least one semiconductor substrate 130 is disposed in a load lock 10A. At this time, the HePA is first executed. Therefore, the semiconductor substrate 130 is disposed in the load lock 10A.

For a technique of the HePA, the load lock 10A is brought into a constant vacuum state, the valve 140A provided between the load lock 10A and the transfer chamber is opened, and the semiconductor substrate 130 is delivered through the arm 90, and is guided to the HePA chamber 40 and is disposed therein. As described in the Non-Patent Document 1, the HePA generates a He plasma for seven seconds at a degree of vacuum of 0.9 Pa, thereby causing a semiconductor single crystal substrate to be amorphous.

In this case, there are two techniques. As a first technique, all of portions forming a semiconductor device such as a transistor are brought into an amorphous state at a time. As a second technique, a portion to be doped into a P type and a portion to be doped into an N type are isolated and patterned by a photoresist, and are separately brought into the amorphous state.

First of all, in the first case, a semiconductor substrate brought into the amorphous state by the HePA chamber 40 once passes through the load lock 10A and is thus delivered to the outside of the apparatus, and is then patterned by a photoresist via a lithographic step, and is subsequently transported to a load lock 10B in order to carry out P-type doping, the load lock 10B is brought into a constant vacuum state and a valve 140B provided between the load lock 10B and the transfer chamber is opened, and the semiconductor substrate 130 is delivered through the arm 100, and is guided to the P-type doping chamber 50 and is disposed therein. As described in the Non-Patent Document 1, a $B_2H_6$ plasma is generated for seven seconds at a degree of vacuum of 0.9 Pa by the P-type doping, and the P-type doping is carried out over the semiconductor substrate. The semiconductor substrate 130 subjected to the P-type doping is delivered to the P-type ashing chamber 70 by means of the arm 100. A resist layer which is degenerated and cured is removed by the P-type doping. Although all of the resists may be removed, it is possible to sufficiently fulfill a function by simply removing a layer having a thickness of approximately 15 nm that is degenerated and cured, in order to avoid an oxidation of the semiconductor substrate. The semiconductor substrate 130 subjected to the ashing is delivered to the outside of the apparatus via the load lock 10B by means of the arm 100.

The semiconductor substrate 130 is subjected to a subsequent posttreatment and a lithographic step, and an N-type doped region is patterned and the semiconductor substrate 130 is thereafter disposed in a load lock 10C. The load lock 10C is brought into a constant vacuum state and a valve 140C provided between the load lock 10C and the transfer chamber is opened, and the semiconductor substrate 130 is delivered through the arm 110, and is guided to the N-type doping chamber 60 and is disposed therein. Herein, a $PH_3$ plasma is generated with a $PH_3$ gas for ten seconds by the N-type doping, and the N-type doping is carried out over the semiconductor substrate. The semiconductor substrate 130 subjected to the N-type doping is delivered to the N-type ashing chamber 80 by means of the arm 110. A resist layer which is degenerated and cured is removed by the N-type doping. Although all of the resists may be removed, it is possible to sufficiently fulfill a function by simply removing a layer having a thickness of approximately 20 nm which is degenerated and cured in order to avoid the oxidation of the semiconductor substrate. The semiconductor substrate 130 subjected to the ashing is delivered to the outside of the apparatus via the load lock 10C by means of the arm 110.

The second case will be described.

At least one semiconductor substrate 130 in which the P-type doped region is patterned by a photoresist via the lithographic step is disposed in the load lock 10A. At this time, the HePA is first executed. Therefore, the semiconductor substrate 130 is disposed in the load lock 10A. The load lock 10A is brought into a constant vacuum state, the valve 140A provided between the load lock 10A and the transfer chamber is opened, and the semiconductor substrate 130 is delivered through the arm 90, and is guided to the HePA chamber 40 and is disposed therein. As described in the Non-Patent Document 1, a He plasma is generated for seven seconds at a degree of vacuum of 0.9 PA, thereby causing a semiconductor single crystal substrate to be amorphous.

For the P-type doping, subsequently, the semiconductor substrate 130 is taken out of the HePA chamber 40 through the arm 90 and is transported to a tray 120A.

Next, the semiconductor substrate 130 put on the tray 120A is delivered through the arm 100, and is guided to the P-type doping chamber 50 and is disposed therein. As described in the Non-Patent Document 1, a $B_2H_6$ plasma is generated for seven seconds at a degree of vacuum of 0.9 Pa by the P-type doping, and the P-type doping is carried out over the semiconductor substrate. The semiconductor substrate 130 subjected to the P-type doping is delivered to the P-type ashing chamber 70 by means of the arm 100. A resist layer which is degenerated and cured is removed by the P-type doping. Although all of the resists may be removed, it is possible to sufficiently fulfill a function by simply removing a layer having a thickness of approximately 15 nm which is degenerated and cured in order to avoid the oxidation of the semiconductor substrate. The semiconductor substrate 130 subjected to the ashing is delivered to the outside of the apparatus via the load lock 10B by means of the arm 100.

The N-type doped region of the semiconductor substrate 130 is patterned via a subsequent posttreatment and a lithographic step, and the semiconductor substrate 130 is then disposed in the load lock 10A.

The load lock 10A is brought into a constant vacuum state, the valve 140A provided between the load lock 10A and the transfer chamber is opened, and the semiconductor substrate 130 is delivered through the arm 90, and is guided to the HePA chamber 40 and is disposed therein. As described in the Non-Patent Document 1, the He plasma is generated for seven seconds at a degree of vacuum of 0.9 Pa by the HePA, thereby causing a semiconductor single crystal substrate to be amorphous.

For the N-type doping, subsequently, the semiconductor substrate 130 is taken out of the HePA chamber 40 through the arm 110 and is transported to a tray 120B.

The semiconductor substrate 130 is delivered through the arm 110, and is guided to the N-type doping chamber 60 and is disposed therein. Herein, a $PH_3$ plasma is generated with a $PH_3$ gas for ten seconds and the N-type doping is carried out over the semiconductor substrate. The semiconductor substrate 130 subjected to the N-type doping is delivered to the N-type ashing chamber 80 by means of the arm 110. A resist layer which is degenerated and cured is removed by the N-type doping. Although all of the resists may be removed, it is possible to sufficiently fulfill a function by simply removing a layer having a thickness of approximately 20 nm which is degenerated and cured in order to avoid the oxidation of the semiconductor substrate. The semiconductor substrate 130 subjected to the ashing is delivered to the outside of the apparatus via the load lock 10C by means of the arm 110.

In the way described above, the necessary P-type and N-type doping for the semiconductor substrate 130 is ended by the first method or the second method, and the semiconductor substrate 130 is transferred to a subsequent annealing step. Since the P-type region and the N-type region have already been close to each other in a hyperfine pattern at the annealing step, it is actually impossible to execute the step separately. However, the delivery and annealing can be carried out in a gas atmosphere which does not react to a semiconductor in a vacuum, with an inert gas or at an ordinary temperature in order to protect a surface of the semiconductor in the same apparatus, a vicinal apparatus subjected to a delivery by a delivering method taking the handling of the surface into consideration or an entirely different apparatus.

SECOND EMBODIMENT

Figure 3:
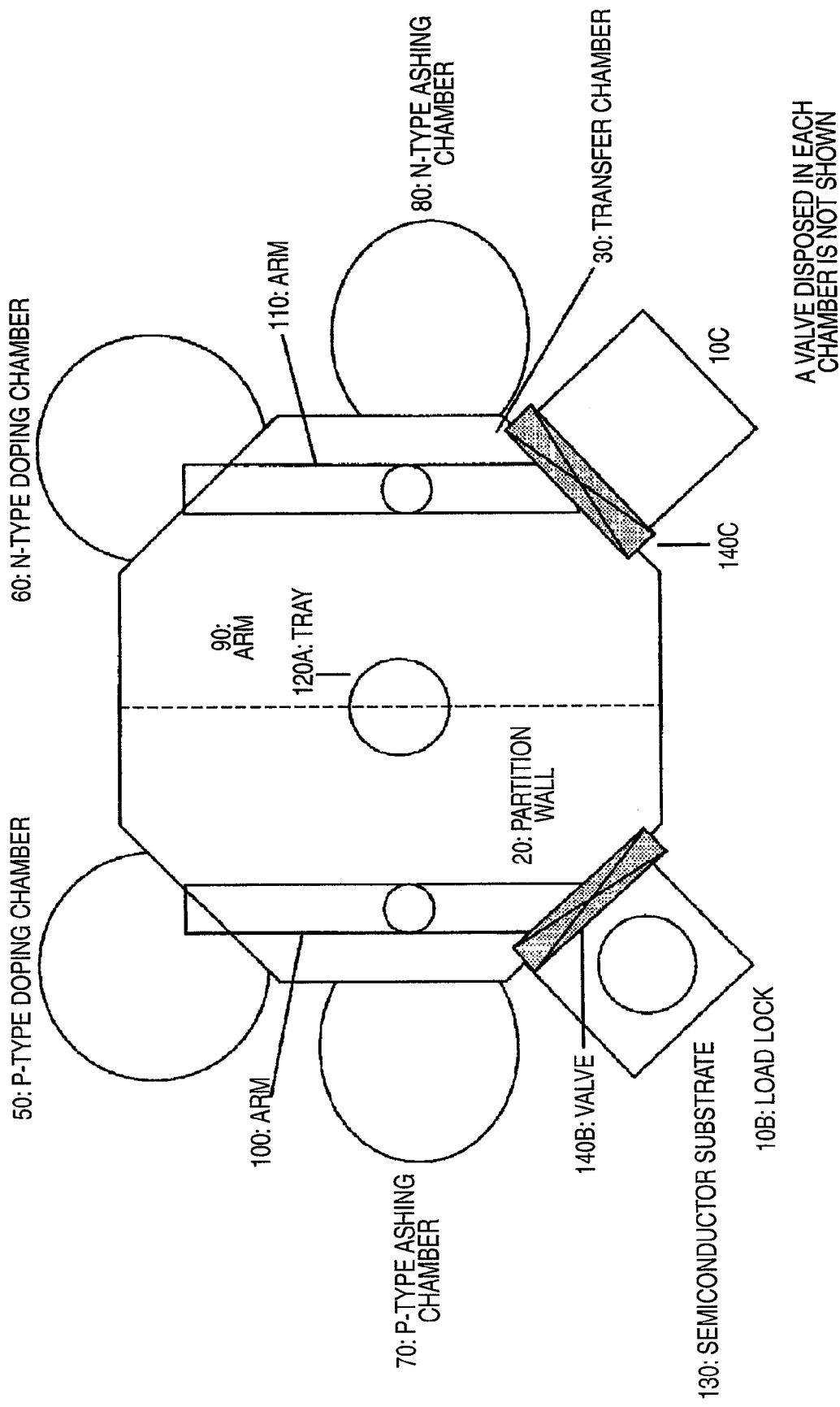
FIG. 3 is a plan view showing an apparatus for explaining a second embodiment according to the invention.

A second embodiment according to the invention will be described with reference to FIG. 3.

In the invention, description will be given to an example in which HePA and doping are carried out in the same chamber.

First of all, an apparatus will be described.

Load locks 10B and 10C are used for P and N types, respectively.

Four plasma chambers are disposed in a transfer chamber 30. The four plasma chambers are constituted by a P-type doping chamber 50 using $B_2H_6$, an N-type doping chamber 60 using $PH_3$, a P-type ashing chamber 70 for removing a photoresist on a semiconductor substrate subjected to P-type doping, and an N-type ashing chamber 80 for removing a photoresist on a semiconductor substrate subjected to N-type doping. In order to deliver the semiconductor substrate among the load lock, the transfer chamber, and the plasma chamber, a robot arm is disposed. The robot arm is designed to be freely rotatable at 360 degrees. In this case, three types of a P-type doping arm 100 and an N-type doping arm 110 are prepared to avoid a mutual mixture. A tray 120 is disposed in such a manner that the semiconductor substrate can be transferred in the HePA portion and the doping portion if necessary.

Description will be given to an embodiment for manufacturing a semiconductor apparatus by using the apparatus.

There are two methods. Referring to a first method, the HePA is first carried out in a P-type chamber and an N-type chamber, and subsequently, P-type or N-type doping is executed. Referring to a second method, a P-type or N-type dopant substance is diluted with He, and PA and doping are simultaneously carried out on a condition that a HePA effect is exhibited at the same time.

First of all, the first method will be described.

At least one semiconductor substrate 130 in which the P-type doped region is patterned by a photoresist via the lithographic step is disposed in a load lock 10B. At this time, the HePA is first executed by using the P-type doping chamber 50.

The load lock 10B is brought into a constant vacuum state, a valve 140B provided between the load lock 10B and the transfer chamber is opened, and the semiconductor substrate 130 is delivered through an arm 100, and is guided to the P-type doping chamber 50 and is disposed therein. Referring to the HePA to be first executed, a He plasma is generated for seven seconds at a degree of vacuum of 0.9 PA, thereby causing a semiconductor single crystal substrate to be amorphous as described in the Non-Patent Document 1.

Next, a reactant gas is switched for P-type doping. As described in the Non-Patent Document 1, a $B_2H_6$ plasma is generated for seven seconds at a degree of vacuum of 0.9 Pa and the P-type doping is carried out over the semiconductor substrate. The semiconductor substrate 130 subjected to the P-type doping is delivered to the P-type ashing chamber 70 by means of the arm 100. A resist layer which is degenerated and cured is removed by the P-type doping. Although all of the resists may be removed, it is possible to sufficiently fulfill a function by simply removing a layer having a thickness of approximately 15 nm which is degenerated and cured in order to avoid an oxidation of the semiconductor substrate. The semiconductor substrate 130 subjected to the ashing is delivered to the outside of the apparatus via the load lock 10B by means of the arm 100.

The N-type doped region of the semiconductor substrate 130 is patterned via a subsequent posttreatment and a lithographic step, and the semiconductor substrate 130 is then disposed in a load lock 10C. First of all, the HePA is also executed over the N-type patterned region by using the N-type doping chamber 60.

The load lock 10C is brought into a constant vacuum state, a valve 140C provided between the load lock 10C and the transfer chamber is opened, and the semiconductor substrate 130 is delivered through the arm 110, and is guided to the N-type doping chamber 60 and is disposed therein. Referring to the HePA to be first executed, the He plasma is generated for seven seconds at a degree of vacuum of 0.9 Pa, thereby causing a semiconductor single crystal substrate to be amorphous as described in the Non-Patent Document 1.

Subsequently, a reactant gas is switched for the N-type doping.

Herein, a $PH_3$ plasma is generated with a $PH_3$ gas for ten seconds by the N-type doping, and the N-type doping is carried out over the semiconductor substrate. The semiconductor substrate 130 subjected to the N-type doping is delivered to the N-type ashing chamber 80 by means of the arm 110. A resist layer which is degenerated and cured is removed by the N-type doping. Although all of the resists may be removed, it is possible to sufficiently fulfill a function by simply removing a layer having a thickness of approximately 20 nm that is degenerated and cured in order to avoid the oxidation of the semiconductor substrate. The semiconductor substrate 130 subjected to the ashing is delivered to the outside of the apparatus via the load lock 10C by means of the arm 110.

Next, the second method will be described.

At least one semiconductor substrate 130 in which the P-type doped region is patterned by a photoresist via a lithographic step is disposed in the load lock 10B. The load lock 10B is brought into a constant vacuum state, the valve 140B provided between the load lock 10B and the transfer chamber 30 is opened, and the semiconductor substrate 130 is delivered through the arm 100, and is guided to the P-type doping chamber 50 and is disposed therein. Herein, a $B_2H_6$ plasma is generated for seven seconds with a $B_2H_6$ gas diluted mainly with He by the P-type doping, and the P-type doping is carried out over the semiconductor substrate. The semiconductor substrate 130 subjected to the P-type doping is delivered to the P-type ashing chamber 70 by means of the arm 100. A resist layer which is degenerated and cured is removed by the P-type doping. Although all of the resists may be removed, it is possible to sufficiently fulfill a function by simply removing a layer having a thickness of approximately 15 nm that is degenerated and cured in order to avoid the oxidation of the semiconductor substrate. The semiconductor substrate 130 subjected to the ashing is delivered to the outside of the apparatus via the load lock 10B by means of the arm 100.

The N-type doped region of the semiconductor substrate 130 is patterned via a subsequent posttreatment and a lithographic step, and the semiconductor substrate 130 is then disposed in the load lock 10C.

The load lock 10C is brought into a constant vacuum state, the valve 140C provided between the load lock 10C and the transfer chamber is opened, and the semiconductor substrate 130 is delivered through the arm 110, and is guided to the N-type doping chamber 60 and is disposed therein. Herein, a $PH_3$ plasma is generated for ten seconds with a $PH_3$ gas diluted mainly with He by the N-type doping, and the N-type doping is carried out over the semiconductor substrate. The semiconductor substrate 130 subjected to the N-type doping is delivered to the N-type ashing chamber 80 by means of the arm 110. A resist layer which is degenerated and cured is removed by the N-type doping. Although all of the resists may be removed, it is possible to sufficiently fulfill a function by simply removing a layer having a thickness of approximately 20 nm that is degenerated and cured, in order to avoid the oxidation of the semiconductor substrate. The semiconductor substrate 130 subjected to the ashing is delivered to the outside of the apparatus via the load lock 10C by means of the arm 110.

In the way described above, the necessary P-type and N-type doping for the semiconductor substrate 130 is ended by the first method or the second method, and the semiconductor substrate 130 is transferred to a subsequent annealing step. Since the P-type region and the N-type region have already been close to each other in a hyperfine pattern at the annealing step, it is actually impossible to execute the step separately. However, the delivery and annealing can be carried out in a gas atmosphere which does not react to a semiconductor in a vacuum, with an inert gas or at an ordinary temperature in order to protect a surface of the semiconductor in the same apparatus, a vicinal apparatus subjected to a delivery by a delivering method taking the handling of the surface into consideration or an entirely different apparatus.

THIRD EMBODIMENT

Figure 4:
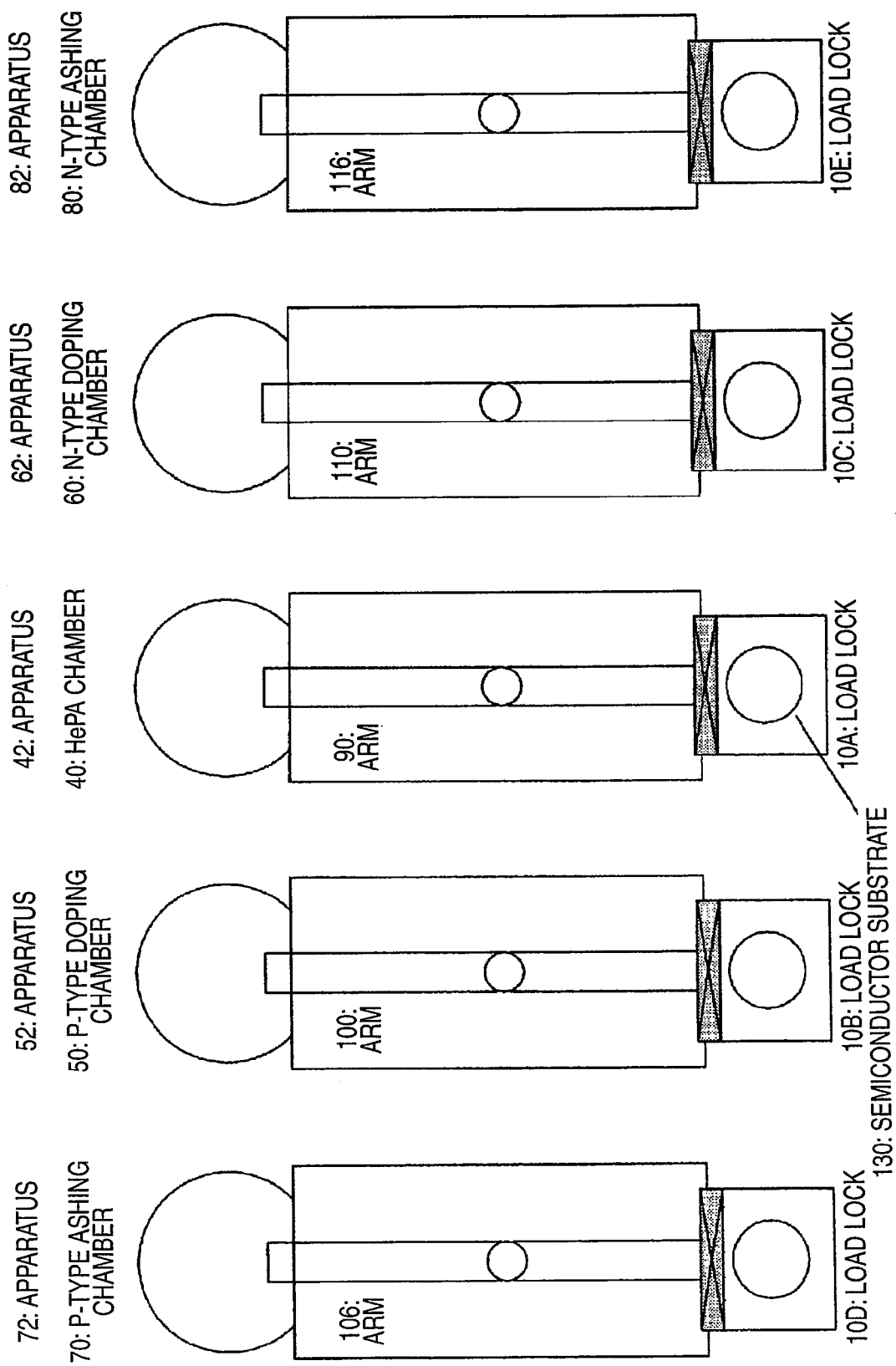
FIG. 4 is a plan view showing an apparatus for explaining a third embodiment according to the invention.
Figure 5:
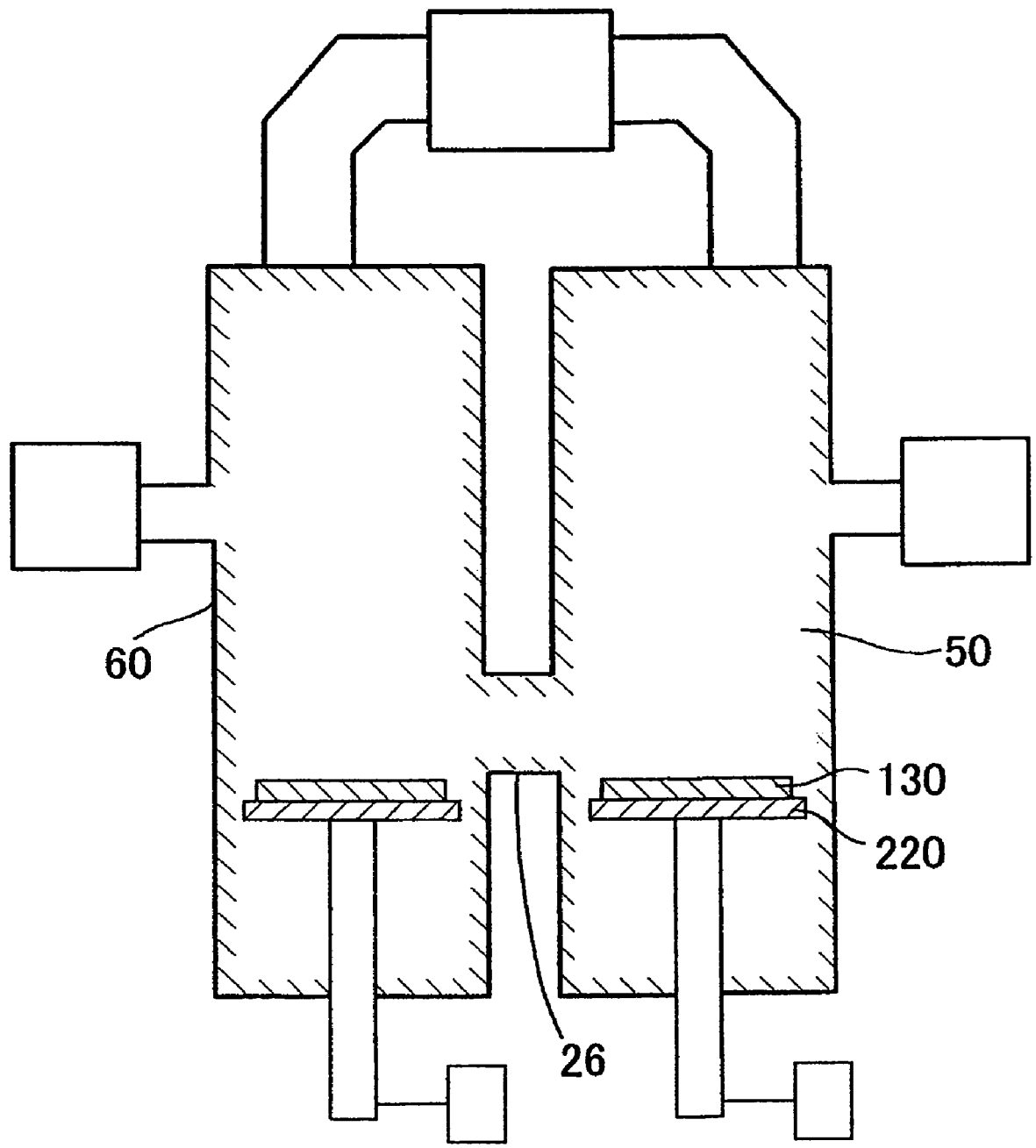
FIG. 5 is a sectional view showing a structure of an apparatus for explaining the background art.

A third embodiment according to the invention will be described with reference to FIG. 4. A plasma doping apparatus is an example in which a plasma in a vacuum state is utilized. It is sufficient to make the best of features of various plasmas and the plasma in the vacuum state is not restricted.

The embodiment features that an apparatus group for carrying out a He plasma amorphization (HePA), and then, impurity doping and removing a photoresist is arranged intentionally to efficiently execute a serial step. Referring to the delivery of the semiconductor substrate, however, by using wafer delivering mechanisms managed highly in a semiconductor manufacturing factory and their managing functions, it is sufficiently possible to exhibit a serial function by the presence of an apparatus group capable of fulfilling the same function even if a great distance is made therebetween or they are not stored in one enclosure for reasons of an arrangement in the factory. In the extreme, also in the case in which a certain step described in the invention is to be executed in a factory A and the other steps are to be executed in a factory B, other adverse effects such as a contamination from an ambient or an increase in particles can be supposed. However, the execution is not very hard in these days in which a highly physical distribution system maintaining a cleanness between the factories is established, and does not distort the essence and main point of the invention but can be achieved.

The case in which apparatuses are intentionally provided intensively in the vicinity will be described again.

Description will be given to a structure of the apparatus. Each apparatus is provided with a load lock 10, a transfer chamber 30 and a plasma chamber. The function of measures in which five apparatuses are provided together is constituted by an apparatus 42 comprising a HePA chamber 40, an apparatus 52 comprising a P-type doping chamber 50 using $B_2H_6$, an apparatus 62 comprising an N-type doping chamber 60 using $PH_3$, an apparatus 72 comprising a P-type ashing chamber 70 for removing a photoresist on a semiconductor substrate subjected to P-type doping, and an apparatus 82 comprising an N-type ashing chamber 80 for removing a photoresist on a semiconductor substrate subjected to N-type doping.

Description will be given to an example in which plasma doping is executed by utilizing these apparatus groups.

Four techniques will be described.

(First Technique)

At least one semiconductor substrate 130 is disposed in a load lock 10A of the apparatus 42 comprising the HePA chamber 40. At this time, the HePA is first executed. The load lock 10A is brought into a constant vacuum state, a valve 140A provided between the load lock 10A and the transfer chamber is opened, and the semiconductor substrate 130 is delivered through an arm 90, and is guided to the HePA chamber 40 and is disposed therein. As described in the Non-Patent Document 1, a He plasma is generated for seven seconds at a degree of vacuum of 0.9 Pa by the HePA, thereby causing a semiconductor single crystal substrate to be amorphous.

The semiconductor substrate brought into the amorphous state by the HePA chamber 40 once passes through the load lock 10A and is thus delivered to the outside of the apparatus, and is then patterned by a photoresist via a lithographic step, and is subsequently transported to a load lock 10B of the apparatus 52 comprising the P-type doping chamber 50 in order to carry out P-type doping, the load lock 10B is brought into a constant vacuum state and a valve 140B provided between the load lock 10B and the transfer chamber is opened, and the semiconductor substrate 130 is delivered through an arm 100, and is guided to the P-type doping chamber 50 and is disposed therein. As described in the Non-Patent Document 1, a $B_2H_6$ plasma is generated for seven seconds at a degree of vacuum of 0.9 Pa by the P-type doping, and the P-type doping is carried out over the semiconductor substrate.

The semiconductor substrate 130 subjected to the P-type doping once passes through the load lock 10A and is delivered to the outside of the apparatus, and is transported to a load lock 10D of the apparatus 72 comprising the P-type ashing chamber 70 for removing a photoresist on the semiconductor substrate subjected to the P-type doping, and the load lock 10D is brought into a constant vacuum state, a valve 140D provided between the load lock 10D and the transfer chamber is opened, and the semiconductor substrate 130 is delivered through an arm 106 and is disposed in the P-type ashing chamber 70. A resist layer which is degenerated and cured is removed by the P-type doping. Although all of the resists may be removed, it is possible to sufficiently fulfill a function by simply removing a layer having a thickness of approximately 15 nm which is degenerated and cured in order to avoid an oxidation of the semiconductor substrate. The semiconductor substrate 130 subjected to the ashing is delivered to the outside of the apparatus via the load lock 10D by means of the arm 106.

The semiconductor substrate 130 is subjected to a subsequent posttreatment and a lithographic step, and an N-type doped region is then patterned, and the semiconductor substrate 130 is thereafter disposed in a load lock 10C of the apparatus 62 comprising the N-type doping chamber 60. The load-lock 10C is brought into a constant vacuum state and a valve 140C provided between the load lock 10C and the transfer chamber is opened, and the semiconductor substrate 130 is delivered through an arm 110, and is guided to the N-type doping chamber 60 and is disposed therein. Herein, a $PH_3$ plasma is generated with a $PH_3$ gas for ten seconds by the N-type doping, and the N-type doping is carried out over the semiconductor substrate. The semiconductor substrate 130 subjected to the N-type doping once passes through the load lock 10C and is delivered to the outside of the apparatus by means of the arm 110, and is delivered to a load lock 10E of the apparatus 82 comprising the N-type ashing chamber 80 for removing the photoresist on the semiconductor substrate subjected to the N-type doping, and is provided in the N-type ashing chamber 80 through an arm 116. A resist layer which is degenerated and cured is removed by the N-type doping. Although all of the resists may be removed, it is possible to sufficiently fulfill a function by simply removing a layer having a thickness of approximately 20 nm which is degenerated and cured in order to avoid the oxidation of the semiconductor substrate. The semiconductor substrate 130 subjected to the ashing is delivered to the outside of the apparatus via the load lock 10E by means of the arm 116.

The second case will be described.

At least one semiconductor substrate 130 subjected to the P-type patterning through the photoresist is disposed in the load lock 10A of the apparatus 42 comprising the HePA chamber 40. At this time, the HePA is first executed. The load lock 10A is brought into a constant vacuum state, the valve 140A provided between the load lock 10A and the transfer chamber is opened, and the semiconductor substrate 130 is delivered through the arm 90, and is guided to the HePA chamber 40 and is disposed therein. As described in the Non-Patent Document 1, a He plasma is generated for seven seconds at a degree of vacuum of 0.9 Pa by the HePA, thereby causing a semiconductor single crystal substrate to be amorphous.

The semiconductor substrate brought into the amorphous state by the HePA chamber 40 once passes through the load lock 10A and is thus delivered to the outside of the apparatus, and is then transported to the load lock 10B of the apparatus 52 comprising the P-type doping chamber 50 in order to carry out P-type doping, the load lock 10B is brought into a constant vacuum state and the valve 140B provided between the load lock 10B and the transfer chamber is opened, and the semiconductor substrate 130 is delivered through the arm 100, and is guided to the P-type doping chamber 50 and is disposed therein. As described in the Non-Patent Document 1, a $B_2H_6$ plasma is generated for seven seconds at a degree of vacuum of 0.9 Pa by the P-type doping, and the P-type doping is carried out over the semiconductor substrate.

The semiconductor substrate 130 subjected to the P-type doping once passes through the load lock 10A and is delivered to the outside of the apparatus, and is transported to the load lock 10D of the apparatus 72 comprising the P-type ashing chamber 70 for removing a photoresist on the semiconductor substrate subjected to the P-type doping, and the load lock 10D is brought into a constant vacuum state, the valve 140D provided between the load lock 10D and the transfer chamber is opened, and the semiconductor substrate 130 is delivered through the arm 106 and is disposed in the P-type ashing chamber 70. A resist layer which is degenerated and cured is removed by the P-type doping. Although all of the resists may be removed, it is possible to sufficiently fulfill a function by simply removing a layer having a thickness of approximately 15 nm that is degenerated and cured, in order to avoid the oxidation of the semiconductor substrate. The semiconductor substrate 130 subjected to the ashing is delivered to the outside of the apparatus via the load lock 10D by means of the arm 106.

The semiconductor substrate 130 is subjected to a subsequent posttreatment and a lithographic step, and an N-type doped region is then patterned and the semiconductor substrate 130 is thereafter disposed in the load lock 10A of the apparatus 42 comprising the HePA chamber 40. The load lock 10A is brought into a constant vacuum state and the valve 140A provided between the load lock 10A and the transfer chamber is opened, and the semiconductor substrate 130 is delivered through the arm 90, and is guided to the HePA chamber 40 and is disposed therein. Herein, a He plasma is generated for seven seconds at a degree of vacuum of 0.9 Pa by the HePA to bring the semiconductor single crystal substrate into an amorphous state as described in the Non-Patent Document 1. In this case, a P-type impurity layer doped earlier is wholly covered with a patterning material such as a photoresist. Therefore, impurities having different characteristics can be prevented from being mixed with each other in the HePA chamber.

The semiconductor substrate brought into the amorphous state by the HePA chamber 40 once passes through the load lock 10A and is thus delivered to the outside of the apparatus, and is disposed in the load lock 10C of the apparatus 62 comprising the N-type doping chamber 60. The load lock 10C is brought into a constant vacuum state and the valve 140C provided between the load lock 10C and the transfer chamber is opened, and the semiconductor substrate 130 is delivered through the arm 110, and is guided to the N-type doping chamber 60 and is disposed therein. Herein, a $PH_3$ plasma is generated with a $PH_3$ gas for ten seconds by the N-type doping, and the N-type doping is carried out over the semiconductor substrate. The semiconductor substrate 130 subjected to the N-type doping once passes through the load lock 10C by means of the arm 110 and is delivered to the outside of the apparatus, and is transported to the load lock 10E of the apparatus 82 comprising the N-type ashing chamber 80 for removing a photoresist on the semiconductor substrate subjected to the N-type doping and is disposed in the N-type ashing chamber 80 through the arm 116. A resist layer which is degenerated and cured is removed by the N-type doping. Although all of the resists may be removed, it is possible to sufficiently fulfill a function by simply removing a layer having a thickness of approximately 20 nm which is degenerated and cured in order to avoid the oxidation of the semiconductor substrate. The semiconductor substrate 130 subjected to the ashing is delivered to the outside of the apparatus via the load lock 10E by means of the arm 116.

A third technique is a method of first carrying out the HePA in a P-type chamber and an N-type chamber and subsequently executing P-type or N-type doping.

At least one semiconductor substrate 130 in which the P-type doped region is patterned by a photoresist via the lithographic step is disposed in the load lock 10B. At this time, the HePA is first executed by using the P-type doping chamber 50.

The load lock 10B is brought into a constant vacuum state, the valve 140B provided between the load lock 10B and the transfer chamber is opened, and the semiconductor substrate 130 is delivered through an arm 100, and is guided to the P-type doping chamber 50 and is disposed therein. Referring to the HePA to be first executed, a He plasma is generated for seven seconds at a degree of vacuum of 0.9 Pa, thereby causing a semiconductor single crystal substrate to be amorphous as described in the Non-Patent Document 1.

Next, a reactant gas is switched for the P-type doping. As described in the Non-Patent Document 1, a $B_2H_6$ plasma is generated for ten seconds at a degree of vacuum of 0.9 Pa by the P-type doping, and the P-type doping is carried out over the semiconductor substrate. The semiconductor substrate 130 subjected to the P-type doping once passes through the load lock 10A and is delivered to the outside of the apparatus, and is transported to the load lock 10D of the apparatus 72 comprising the P-type ashing chamber 70 for removing a photoresist on the semiconductor substrate subjected to the P-type doping and is disposed in the P-type ashing chamber 70. A resist layer which is degenerated and cured is removed by the P-type doping. Although all of the resists may be removed, it is possible to sufficiently fulfill a function by simply removing a layer having a thickness of approximately 15 nm which is degenerated and cured in order to avoid the oxidation of the semiconductor substrate.

The semiconductor substrate 130 subjected to the ashing is delivered to the outside of the apparatus via the load lock 10D by means of the arm 100.

The semiconductor substrate 130 is subjected to a subsequent posttreatment and a lithographic step, and an N-type doped region is patterned and the semiconductor substrate 130 is thereafter disposed in the load lock 10C. First of all, the HePA is also executed over a region subjected to N-type patterning by using the N-type doping chamber 60.

The load lock 10C is brought into a constant vacuum state, the valve 140C provided between the load lock 10C and the transfer chamber is opened, and the semiconductor substrate 130 is delivered through the arm 110, and is guided to the N-type doping chamber 60 and is disposed therein. Referring to the HePA to be first executed, a He plasma is generated for seven seconds at a degree of vacuum of 0.9 Pa, thereby causing a semiconductor single crystal substrate to be amorphous as described in the Non-Patent Document 1.

Then, a reactant gas is switched for the N-type doping.

Herein, a $PH_3$ plasma is generated with $PH_3$ for ten seconds by the N-type doping, and the N-type doping is carried out over the semiconductor substrate. The semiconductor substrate 130 subjected to the N-type doping once passes through the load lock 10C by means of the arm 110 and is thus delivered to the outside of the apparatus.

Subsequently, the semiconductor substrate 130 is delivered to the load lock 10E of the apparatus 82 comprising the N-type ashing chamber 80 for removing the photoresist on the semiconductor substrate subjected to the N-type doping, and is disposed in the N-type ashing chamber 80 through the arm 116. Herein, a resist layer which is degenerated and cured is removed by the N-type doping. Although all of the resists may be removed, it is possible to sufficiently fulfill a function by simply removing a layer having a thickness of approximately 20 nm that is degenerated and cured, in order to avoid the oxidation of the semiconductor substrate. The semiconductor substrate 130 subjected to the ashing is delivered to the outside of the apparatus via the load lock 10C by means of the arm 110.

Referring to a fourth technique, a P-type or N-type dopant substance is diluted with He, and PA and doping are simultaneously carried out on a condition that a HePA effect is exhibited at the same time.

The load lock 10B is provided with at least one semiconductor substrate 130 in which the P-type doped region is patterned with a photoresist through a lithographic step.

The load lock 10B is brought into a constant vacuum state, the valve 140B provided between the load lock 10B and the transfer chamber is opened, and the semiconductor substrate 130 is delivered through the arm 110, and is guided to the P-type doping chamber 50 and is disposed therein. Herein, a $B_2H_6$ plasma is generated for seven seconds with a $B_2H_6$ gas diluted mainly with He by the P-type doping, and the P-type doping is carried out over the semiconductor substrate. The semiconductor substrate 130 subjected to the P-type doping once passes through the load lock 10A and is delivered to the outside of the apparatus, and is transported to the load lock 10D of the apparatus 72 comprising the P-type ashing chamber 70 for removing a photoresist on the semiconductor substrate subjected to the P-type doping and is disposed in the P-type ashing chamber 70. A resist layer which is degenerated and cured is removed by the P-type doping. Although all of the resists may be removed, it is possible to sufficiently fulfill a function by simply removing a layer having a thickness of approximately 15 nm which is degenerated and cured in order to avoid the oxidation of the semiconductor substrate. The semiconductor substrate 130 subjected to the ashing is delivered to the outside of the apparatus via the load lock 10D by means of the arm 100.

The semiconductor substrate 130 is subjected to a subsequent posttreatment and a lithographic step, and an N-type doped region is patterned and the semiconductor substrate 130 is thereafter disposed in the load lock 10C.

Herein, a $PH_3$ plasma is generated for ten seconds with a $PH_3$ gas diluted mainly with He by the N-type doping, and the N-type doping is carried out over the semiconductor substrate. The semiconductor substrate 130 subjected to the N-type doping once passes through the load lock 10C by means of the arm 110 and is thus delivered to the outside of the apparatus.

Subsequently, the semiconductor substrate 130 is delivered to the load lock 10E of the apparatus 82 comprising the N-type ashing chamber 80 for removing the photoresist on the semiconductor substrate subjected to the N-type doping, and is disposed in the N-type ashing chamber 80 through the arm 116. Herein, a resist layer which is degenerated and cured is removed by the N-type doping. Although all of the resists may be removed, it is possible to sufficiently fulfill a function by simply removing a layer having a thickness of approximately 20 nm which is degenerated and cured in order to avoid the oxidation of the semiconductor substrate. The semiconductor substrate 130 subjected to the ashing is delivered to the outside of the apparatus via the load lock 10C by means of the arm 110.

In the way described above, the necessary P-type and N-type doping for the semiconductor substrate 130 is ended by the first to fourth methods, and the semiconductor substrate 130 is transferred to a subsequent annealing step. Since the P-type region and the N-type region have already been close to each other in a hyperfine pattern at the annealing step, it is actually impossible to execute the step separately. However, the delivery and annealing can be carried out in a gas atmosphere which does not react to a semiconductor in a vacuum, with an inert gas or at an ordinary temperature in order to protect a surface of the semiconductor in the same apparatus, a vicinal apparatus subjected to a delivery by a delivering method taking the handling of the surface into consideration or an entirely different apparatus.

If $B_2H_6$ or $PH_3$ used as an example in all of the embodiments is utilized, moreover, hydrogen is also introduced when boron or phosphorus is to be introduced. In this case, if the hydrogen does not carry out a nonpreferable action in a semiconductor apparatus as a result, it may be introduced at the same time. Although the description has not been given in the embodiments, a $BF_3$ gas is often used in the semiconductor industry. At this time, fluorine is also introduced when boron is to be introduced. In this case, if the fluorine does not carry out a nonpreferable action in a semiconductor apparatus as a result, it may be introduced at the same time.

INDUSTRIAL APPLICABILITY

In an introduction of an impurity into a semiconductor substrate in a manufacture of a semiconductor apparatus, it is possible to prevent substances retaining electrically positive and negative characteristics from being mixed at a certain step, thereby controlling an amount of the introduction of the impurity with high precision. Therefore, the invention is effective for manufacturing a fine semiconductor integrated circuit apparatus such as a VLSI.

The invention claimed is:

1. A plasma doping apparatus for doping materials by using plasma for a substrate, comprising:

a first chamber group having a first plasma doping chamber for doping a first impurity material and a second plasma doping chamber for doping a second impurity material;

a first delivering mechanism configured to deliver the substrate to or from the first plasma doping chamber; and a second delivering mechanism configured to deliver the substrate to or from the second plasma doping chamber, wherein;

all components of the first and second delivery mechanisms are completely separated from each other by a partition wall, the first and second plasma doping chambers are disposed in a transfer chamber, the first plasma doping chamber is configured to carryout P-type doping and the second plasma doping chamber is configured to carryout N-type doping, and the first and second plasma doping chambers are separated from each other and are disposed in a closed space.

2. The plasma doping apparatus according to claim 1, further comprising a second chamber group having a third chamber for treating the substrate doped with the first impurity material and a fourth chamber for treating the substrate doped with the second impurity material, wherein:

the treatments carried out in the second chamber group are different from the treatments carried out in the first chamber group, and the third and fourth chambers are disposed in the transfer chamber.

3. The plasma doping apparatus according to claim 2, wherein the third and fourth chambers are configured to carryout a treatment for removing a resist layer formed on the substrate.

4. The plasma doping apparatus according to claim 2, wherein a chamber of the first chamber group and a chamber of the second chamber group that treat the same impurity material are arranged to be closed in the same space.

* * * * *

UNITED STATES PATENT AND TRADEMARK OFFICE
CERTIFICATE OF CORRECTION

| | |
|---|---|
| PATENT NO. | : 7,622,725 B2 |
| APPLICATION NO. | : 12/122492 |
| DATED | : November 24, 2009 |
| INVENTOR(S) | : Bunji Mizuno et al. |

It is certified that error appears in the above-identified patent and that said Letters Patent is hereby corrected as shown below:

On the title page:

Under Item "(73) Assignee", change "Panaosnic Corporation" to --Panasonic Corporation--.

Signed and Sealed this
Twelfth Day of April, 2011

David J. Kappos
*Director of the United States Patent and Trademark Office*